United States Patent [19]

Abbey

[11] 4,025,874

[45] May 24, 1977

[54] MASTER/SLAVE CLOCK ARRANGEMENT FOR PROVIDING RELIABLE CLOCK SIGNAL

[75] Inventor: Duane L. Abbey, Cedar Rapids, Iowa

[73] Assignee: Rockwell International Corporation, El Segundo, Calif.

[22] Filed: Apr. 30, 1976

[21] Appl. No.: 681,952

[52] U.S. Cl. .............................. 331/55; 307/219; 328/61; 331/56

[51] Int. Cl.² .............................. H03B 3/06

[58] Field of Search .......... 331/49, 55, 56; 328/61, 328/104, 154; 307/219

[56] References Cited

UNITED STATES PATENTS

| | | | |
|---|---|---|---|
| 3,116,477 | 12/1963 | Bradbury | 331/56 |
| 3,265,987 | 8/1966 | Hahnel | 331/56 |
| 3,289,097 | 11/1966 | Martin | 331/56 |
| 3,293,562 | 12/1966 | Hahnel | 331/56 |
| 3,431,510 | 3/1969 | Reis et al. | 331/49 |
| 3,479,603 | 11/1969 | Overstreet, Jr. | 307/219 |
| 3,599,111 | 8/1971 | Butler, Jr. | 331/56 |
| 3,619,661 | 11/1971 | Butler, Jr. | 331/56 |
| 3,662,277 | 5/1972 | White | 331/56 |
| 3,751,685 | 8/1973 | Jaeger | 307/219 |
| 3,769,607 | 10/1973 | Thelen | 331/56 |
| 3,795,872 | 3/1974 | Napolitano et al. | 331/55 |
| 3,965,432 | 6/1976 | Denenberg et al. | 331/56 |

OTHER PUBLICATIONS

IBM Tech. Disc. Bul. "Redundancy Technique for Crystal Oscillators" Duke et al., vol. 12, No. 1, June 1969, p. 147.

*Primary Examiner*—John Kominski
*Attorney, Agent, or Firm*—Howard R. Greenberg; Robert J. Crawford

[57] ABSTRACT

The outputs of two like frequency oscillators are combined to form a single reliable clock signal, with one oscillator functioning as a slave under the control of the other to achieve phase coincidence when the master is operative and in a free-running mode when the master is inoperative so that failure of either oscillator produces no effect on the clock signal.

19 Claims, 1 Drawing Figure

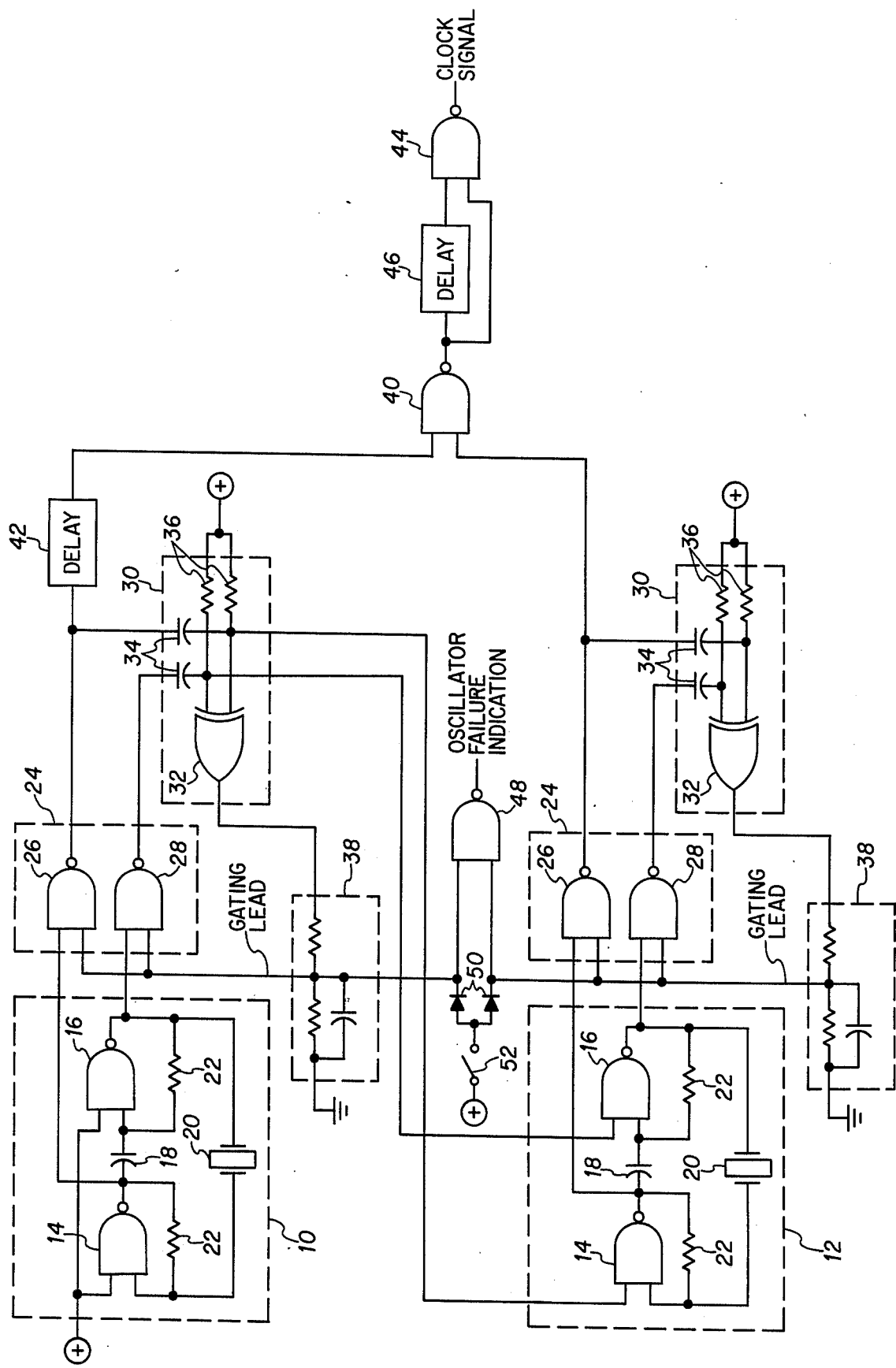

MASTER/SLAVE CLOCK ARRANGEMENT FOR PROVIDING RELIABLE CLOCK SIGNAL

The invention described herein was made in the performance of work under NASA Contract No. NAS-10-8627 and is subject to the provisions of Section 305 of the National Aeronautics and Space Act of 1958 (72Stat. 435; 42 U.S.C. 2457).

BACKGROUND OF THE INVENTION

The present invention pertains generally to oscillator circuits and in particular to a master/slave arrangement for enhancing reliability thereof by providing two oscillators either of which is capable of supplying the output clock signal in the absence of the other.

As is well known, digital electronics circuits require a clock source for providing a periodic (square wave) signal which is used to perform various signal processing functions such as timing, synchronizing, framing, etc. Although various type oscillators, such as crystal oscillators, which employ a piezoelectric crystal for establishing the frequency of operation, have come to be fairly reliable, there may be situations when the circuit in which the oscillator is employed requires even a higher level of component reliability. In those cases, it may be necessary or at least desirable to provide a second oscillator as backup to the first thus assuring the availability of a clock signal in the eventuality that, the first oscillator fails.

With the foregoing in mind, it is a primary object of the present invention to provide a clock source which affords a highly reliable clock signal.

It is a further object of the present invention to provide such source through the use of a master/slave clock arrangement employing two oscillators which affords a smooth transition from a normal mode of operation to a failure mode of operaion so that the clock signal is not affected thereby.

It is still a further object of the present invention to provide such an arrangement which is simple in design and lends itself easily to integrated circuit techniques for commercial implementation.

The foregoing objects, as well as others, and the means by which they are achieved through the present invention may best be appreciated by referring to the Detailed Description of the Preferred Embodiment which follows hereinafter, together with the single drawing FIGURE, which is a schematic rendition thereof.

BRIEF DESCRIPTION OF THE INVENTION

In accordance with the stated objects, the invention herein employs two oscillators of like frequency, each of which provides complementary output signals, viz. two outputs which are opposite in polarity. When operative, one of the oscillators functions as a master to control the phase of the other by applying its outputs thereto through a gating circuit which is enabled during this time by the output of a detector circuit that monitors the two outputs of the master oscillator for the presence of oscillatory signals. Upon detecting the cessation of signal oscillations in either or both of the master oscillator outputs, the detector circuit disables the gating circuit so as to permit the slave oscillator to continue operating in a free-running mode without any phase alteration in its signal output. The output of the slave oscillator is combined with that of the master to produce a single clock signal through its own gating circuit which is controlled in a like manner to that of the master oscillator by its own detector circuit. Consequently, a failure in the slave oscillator isolates it from the combined clock signal output to permit uninterrupted operation. The two oscillator outputs are combined in a circuit which may comprise a simple NAND gate to produce a single clock output. Also, means are provided for blanking out any signal perturbations from appearing in the single clock signal output which may appear at the output of an oscillator upon its failure at the transition time. A delay circuit is also provided in the path between the master clock output and the combining circuit to insure phase coincidence with the slave oscillator output which is controlled therefrom and which will engender some signal delay intrinsic to the slave oscillator logic circuit elements.

The detector circuits may employ a simple exclusive OR circuit for detecting cessation of signal oscillations in at least one of the outputs of the associated oscillator to produce a signal for disabling the associated gating circuit. The slave oscillator may comprise a pair of inverter gates serially connected with a piezoelectric crystal with each of the gates having a second input controlled by a different one of the outputs of the master oscillator gating circuit responsive to the output complementary oscillatory signals thereof for locking its phase to that of the master oscillator when it is operative and being non-responsive thereto so as to operate in a free-running mode when the master oscillator gating circuit is disabled upon failure of the master oscillator.

DETAILED DESCRIPTION OF THE PREFERRED EMBODIMENT

As shown in the attached drawing, the master/slave clock arrangement of the invention comprises a pair of oscillators 10 and 12, functioning respectively, as master and slave, to provide complementary output signals, viz. the two outputs of each are opposite in polarity with some fixed reference (such as ground, which although not shown in the drawing with respect to the logic elements, does comprise each logic element for establishing a reference base for the logic signals). Each of the oscillators 10 and 12 comprises a pair of inverter gates 14 and 16 which provide the complementary output signals and which are separated by a DC blocking capacitor 18 and serially connected with a piezoelectric crystal 20. The resistors 22 interconnecting the inverter gate inputs and outputs provide temperature stabilization as well as insurance that the gates operate in a linear region for starting. The master oscillator 10 is started by applying a positive potential to the second input of each of its inverter gates 14 and 16 to enable them. As will be readily apparent to those skilled in the art, the type of oscillator shown (which was described on page 91 of the May 1969 issue of Electronic Engineer) affords the requisite 360° phase shift and unity gain amplification around the loop by virtue of the two inverter gates, 14 and 16, to maintain oscillations. The frequency of oscillation (which should be the same for both oscillators 10 and 12 within acceptable tolerances) is of course determined primarily by the piezoelectric crystal 20 in conjunction with the values for resistors 22.

The complementary outputs of each oscillator 10 and 12, are applied to individual gating circuits 24 associated therewith, with each gating circuit 24 comprising a pair of NAND gates 26 and 28 having one input connected to a different one of the two outputs of its associated oscillator (gate 26 input connected to inverter gate 14 output and gate 28 input connected to inverter gate 16 output) and a second input connected in common to a gating lead for receiving enable/disable signals (employing normal logic conventions, a 1 constitutes a high level signal which enables while a 0 constitutes a low level signal which disables). Thus, an enable signal to either gating circuit 24 via its gating lead permits the input signals (such as the complementary oscillatory signals) to NAND gates 26 and 28 to be inverted at their respective outputs while a disable signals forces their outputs to a high level signal irrespective of the level signal applied to their inputs. When enabled, complementary oscillatory signals at the inputs of NAND gates 26 and 28, of course produce inverse complementary oscillatory signals at their outputs.

Associated with each oscillator 10 and 12, is a detector circuit 30 for detecting the cessation of oscillations at either or both the two outputs of its associated oscillator. Each detector circuit 30 comprises an exclusive OR gate 32 having its two inputs preferably connected to a different one of the outputs of its associated gating circuit 24 through individual DC blocking capacitors 34. The two inputs to exclusive OR gate 32 are also connected to a positive (high level signal) potential by individual resistors 36. Since at the frequency of oscillation the capacitors 34 are designed to appear as a short, it is to be noted that under normal operation the complementary oscillatory signal outputs of each gating circuit 24 produce a high level signal at the output of the exclusive OR gate 32 in its associated detector circuit 30, to indicate that the associated oscillator is functioning properly. Should an oscillator fail so that its two outputs assume either a high or a low level signal state, the like signal levels produced at the outputs of NAND gates 26 and 28 in the associated gating circuit 24 force the output of the exclusive OR gate 32 in the associated detector circuit 30 to assume a low level thereby indicating the failure. Should an oscillator fail in such a manner that the output signals from its associated gating circuit 24 are complementary, but not oscillatory, the AC coupling afforded by DC blocking capacitors 34 assures that the output of the associated exclusive OR gate will still be at a low level thus indicating that a failure has occurred. Moreover, should an oscillator fail so that one of its outputs remains oscillatory while the other assumes a DC level (such as by a break in the lead to the associated NAND gate 26 or 28), a low level signal will still be produced at the output of the associated exclusive OR gate 32 the first time that the NAND gate of the associated gating circuit 24 which is connected to the oscillatory output assumes the same logic level as the other NAND gate to which the DC level is applied. Thus, no matter how the oscillator fails, the condition will be detected by the associated detector circuit 30 and so indicated by a low level signal at the output of the associated exclusive OR gate 32. It is to be noted that the detector circuit 30 preferably is connected to the output of the gating circuit 24 in order to take advantage of the squarewave shaping performed by the NAND gates 26 and 28 as a result of their buffering action. The detector circuit 30 could just as well be connected directly to the outputs of its associated oscillator in the presence of an acceptable squarewave thereat. The output of each exclusive OR gate 32 is applied to the gating lead of the commonly connected inputs of the associated gating circuit NAND gates 26 and 28 preferably through a low-pass filter 38 which removes any AC signal frequencies which might be present.

Each of the inverter gates 14 and 16 in slave oscillator 12 has a second input connected to a different one of the outputs of the master oscillator gating circuit 24, preferably via the DC blocking capacitors 34 in the master oscillator associated detector circuit 30. As already mentioned, the outputs of each gating circuit 24 will be complementary oscillatory signals when the associated oscillator is functioning properly and high level signals when the associated oscillator malfunctions, having been forced into this logic state by the disable signal appearing at the output of the associated exclusive OR gate 32 upon detection thereof which is applied to the gating lead. Thus, when the master oscillator 10 is functioning properly and its associated gating circuit 24 is enabled, the low level signal produced at one of its NAND gates 26 or 28 disables and forces the inverter gate of the slave oscillator 12 to which it is applied to produce a high level signal at its output (which in turn causes the other inverter gate of the slave oscillator 12 to produce a low level signal at its output). Thus, with both the mater and slave oscillators operating normally, the outputs from their respective NAND gates 26 will be oscillatory and in phase with each other (except for the minor lag between the output of the slave oscillator associated NAND gate 26 and the low level triggering signal at its inverter input caused by the finite delay characteristics of the logic elements). Should master oscillator 10 experience some failure, the high level signals produced at the output of its associated gating circuit 24 merely provide enable signals to the inverter gates 14 and 16 of slave oscillator 12 to permit it to continue operating in a free-running mode so that its associated gating circuit 24 continues to produce output complementary oscillatory signals. In this connection, it is to be noted that applying the input control signals to the slave oscillator 12 via D,C. blocking capacitors 34 as shown, rather than directly from the outputs of the master oscillator associated gating circuit 24 assures the continued operation of the slave oscillator 12 even should one of the NAND gates 26 or 28 thereof fail so as to produce a low level output, thus further enhancing reliability.

The two inputs of the master and slave gating circuit NAND gates 26 may be combined to form a single clock by applying them as separate inputs to a NAND gate 40, the master gating circuit NAND gate 26 output preferably being applied via a delay circuit 42 to compensate for the logic element delays previously alluded to. The output of NAND gate 40 may be used directly as the single clock source or preferably may be applied to another NAND gate 44 via one input thereof directly and the other input via a delay circuit 46. Although the failure of either the master or slave oscillator results in a high level signal at its respective input to NAND gate 40 to produce an enable signal which does not affect the clock signal produced at the output of NAND gate 40, it is possible that at the moment an oscillator fails a negative spike will be produced which will appear in the clock signal at the output of NAND gate 40. By making the delay introduced by delay circuit 46 greater than the maximum duration anticipated for this spike, it may be blanked out so that it does not appear in the output of NAND gate 44. Although the delay introduced by delay circuit 46 may alter the duty cycle of the clock signal produced at the output of NAND gate 46, the change will be ever so slight since the spike duration will of course be much less than the cyclical period at the operating frequency for the oscillators and therefore the delay may be relatively short.

An oscillator failure indication may be provided by connecting the outputs of the exclusive OR gates 32 at the gating leads as separate inputs to a NAND gate 48 whose output produce a high level signal any time that either or both oscillators fail. To permit an oscillator which has failed to resume normal operation upon correction of the malfunction, a high level signal may be applied to the associated gating lead to override the low level output of the associated exclusive OR gate (which acts as a latch upon failure of its associated oscillator) through individual diodes 50 upon closure of switch 52.

As the foregoing detailed decription demonstrates, the master/slave clock arrangement of the invention provides a simple, albeit effective circuit for providing a highly reliable clock signal. Moreover, the invention can be implemented quite easily employing integrated circuit techniques so as to be highly attractive and commercially competitive for digital electronics applications. Since no doubt, modifications to the preferred embodiment detailed herein will occur to those skilled in the art which may not constitute a departure from the scope and spirit of the invention, the foregoing description is intended to be merely exemplary and not circumscriptive of the invention as it will now be claimed hereinbelow.

What is claimed is:

1. A master/slave clock arrangement comprising:
a first oscillator for providing complementary signals;
first gating circuit means for passing the outputs of said first oscillator in response to an enable signal and inhibiting their passage in response to a disable signal;
first detector circuit means for detecting signal oscillations in both outputs of said first oscillator and for generating said enable and disable signals respectively when oscillations are present in both or less than both outputs, and
a second oscillator for providing complementary signals at a frequency like that of said first oscillator whose phase is controlled by the outputs of said first gating circuit means when it is enabled and which operates in a free-running mode when said first gating circuit means is disabled.

2. The arrangement of claim 1 wherein said first gating circuit means comprises a pair of gates, each having a first input connected to a different one of the outputs of said first oscillator and a second input for receiving said enable and disable signals for providing a bilevel output signal in response to an oscillatory input signal when enabled and a predetermined one of the two signal levels when disabled.

3. The arrangement of claim 2 wherein said second oscillator comprises two inverter gates serially connected with each of said inverter gates having a second input connected to the output of a different one of said pair of gates for controlling the respective inverter gate output whereby said predetermined signal level enables the inverter gate and the signal level complementary thereto disables it.

4. The arrangement of claim 2 wherein said first detector circuit means comprises comparator means for generating said enable signal when the outputs of said pair of gates are complementary and said disable signal when they are not.

5. The arrangement of claim 4 wherein said comparator means is an exclusive OR gate having each of its inputs connected to the output of a different one of said pair of gates and said enable and disable signals are constituted respectively by high and low level signals at its output.

6. The generator of claim 5 wherein said first detector circuit means further includes capacitor circuit means for A.C. coupling the inputs of said exclusive OR gate to the outputs of said pair of gates.

7. The arrangement of claim 1 including second gating circuit means for passing the outputs of said second oscillator in response to an enable signal and inhibiting their passage in response to a disable signal and second detector circuit means for detecting signal oscillations in both outputs of said second oscillator and for generating said enable and disable signals respectively when oscillations are present in both or less than both outputs.

8. The arrangement of claim 7 including means for combining the in-phase outputs of said first and second gating circuit means into a single signal which is oscillatory so long as at least one of the gating circuit means outputs is oscillatory.

9. The arrangement of claim 8 wherein said combining means comprises a NAND gate having two inputs each of which is connected to receive a different one of said first and second gating circuit means in phase outputs.

10. The arrangment of claim 8 including means for delaying the output of said first gating circuit means before applying it to said combining means so that the two inputs thereto are in-phase.

11. The arrangement of claim 8 including means for blanking out any signal perturbation produced upon termination of oscillations at the output of either said first or second gating circuit means.

12. The arrangement of claim 8 wherein each of said gating circuit means comprises a pair of gates, each having a first input connected to a different one of the outputs of its associated oscillator and a second input for receiving said enable and a disable signals for providing a bilevel output signal in response to an oscillatory input signal when enabled and a predetermined one of the two signal levels when disabled.

13. The arrangement of claim 12 wherein each of said detector circuit means comprises comparator means for generating said enable signal when the outputs of its respective pair of gates are complementary and said disable signal when they are not.

14. The arrangement of claim 13 wherein each of said comparator means is an exclusive OR gate having each of its inputs connected to the output of a different one of its associated pair of gates and said enable and disable signals are constituted respectively by high and low level signals at its output.

15. The arrangement of claim 14 wherein each of said detector circuit means further includes capacitor circuit means for A.C. coupling the inputs of its associated exclusive OR gate to the outputs of its associated pair of gates.

16. The arrangement of claim 15 including fault indicating means for providing a signal that oscillations have ceased at the output of at least one of said first and second gating circuit means.

17. The arrangement of claim 16 including means for overriding the output of said detector circuit means to provide said enable signal.

18. The arrangement of claim 15 including low-pass filter means for passing the output of said detector circuit means to its associated gating circuit means.

19. The arrangement of claim 17 including low-pass filter means for passing the output of said detector circuit means to its associated gating circuit means.

* * * * *

UNITED STATES PATENT AND TRADEMARK OFFICE
CERTIFICATE OF CORRECTION

PATENT NO. : 4,025,874
DATED : May 24, 1977
INVENTOR(S) : DUANE L. ABBEY

It is certified that error appears in the above-identified patent and that said Letters Patent are hereby corrected as shown below:

Column 1, line 37, delete "operaion" and substitute therefor --operation--;

Column 3, line 6, delete "1consti-" and substitute therefor --1 consti- --;

Column 3, line 7, delete "0consti-" and substitute therefor --0 consti- --;

Column 3, line 12, delete "signals" and substitute therefor --signal--;

Column 4, line 24, delete "mater" and substitute therefor --master; and

Column 4, line 40, delete "D, C." and substitute therefor --D.C.--.

Signed and Sealed this sixteenth Day of August 1977

[SEAL]

Attest:

RUTH C. MASON
Attesting Officer

C. MARSHALL DANN
Commissioner of Patents and Trademark